United States Patent [19]

Jensen

[11] Patent Number: 4,501,007
[45] Date of Patent: Feb. 19, 1985

[54] CCD DIFFERENTIATOR

[75] Inventor: William E. Jensen, San Pedro, Calif.

[73] Assignee: Hughes Aircraft Company, El Segundo, Calif.

[21] Appl. No.: 88,801

[22] Filed: Oct. 29, 1979

Related U.S. Application Data

[63] Continuation of Ser. No. 909,329, May 25, 1978, abandoned.

[51] Int. Cl.³ .................... G11C 19/28; H01L 29/78
[52] U.S. Cl. .......................................... 377/60; 357/24
[58] Field of Search ...................... 357/24; 307/221 D

[56] References Cited

U.S. PATENT DOCUMENTS

| | | | |
|---|---|---|---|
| 3,969,634 | 7/1976 | Su et al. | 357/24 |
| 4,092,549 | 5/1978 | Prince | 357/24 |
| 4,099,197 | 7/1978 | Ibrahim et al. | 357/24 |
| 4,112,456 | 9/1978 | Lampe et al. | 357/24 |
| 4,139,782 | 2/1979 | Ablassmeier | 357/24 |

OTHER PUBLICATIONS

Sequin et al., "A Symmetrically Balanced Linear Differential Charge-Splitting Input for Charge-Coupled Devices", IEEE Trans. Electron Devices, vol. ED-24, (6/77), pp. 746-750.

Primary Examiner—Gene M. Munson
Attorney, Agent, or Firm—W. J. Benman, Jr.; A. W. Karambelas

[57] ABSTRACT

A charge transfer differentiator having a layer of semiconductor material and a contiguous film of overlying electrically insulating material includes a first electrode fed by a first voltage wherein the first electrode is embedded in the film, for establishing an electric potential at the interface between the film and layer. A second electrode fed by a second voltage and a third electrode fed by a third voltage are embedded in the film and charge-coupled to the first electrode for establishing potential barriers at said interface. These electrodes and voltages provide a potential well at the interface. Also included is a fourth electrode embedded in the layer fed by a fourth voltage, and a fifth and sixth electrode separated from each other and embedded in the film, wherein the fifth and sixth electrodes are fed by a clock voltage, the fourth, fifth and sixth electrodes are charge-coupled to the second electrode so as to provide a constant input charge to the potential well. All electrodes and their applied voltages providing differentiation of either the first or the third voltage.

2 Claims, 7 Drawing Figures

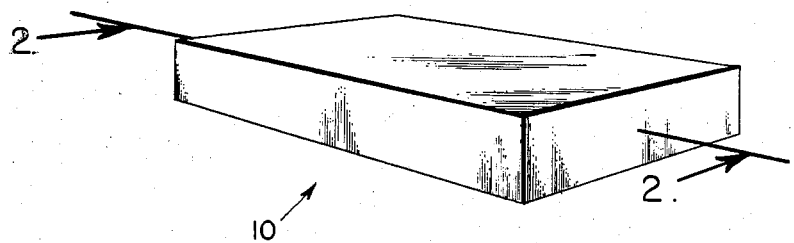
Fig. 1.
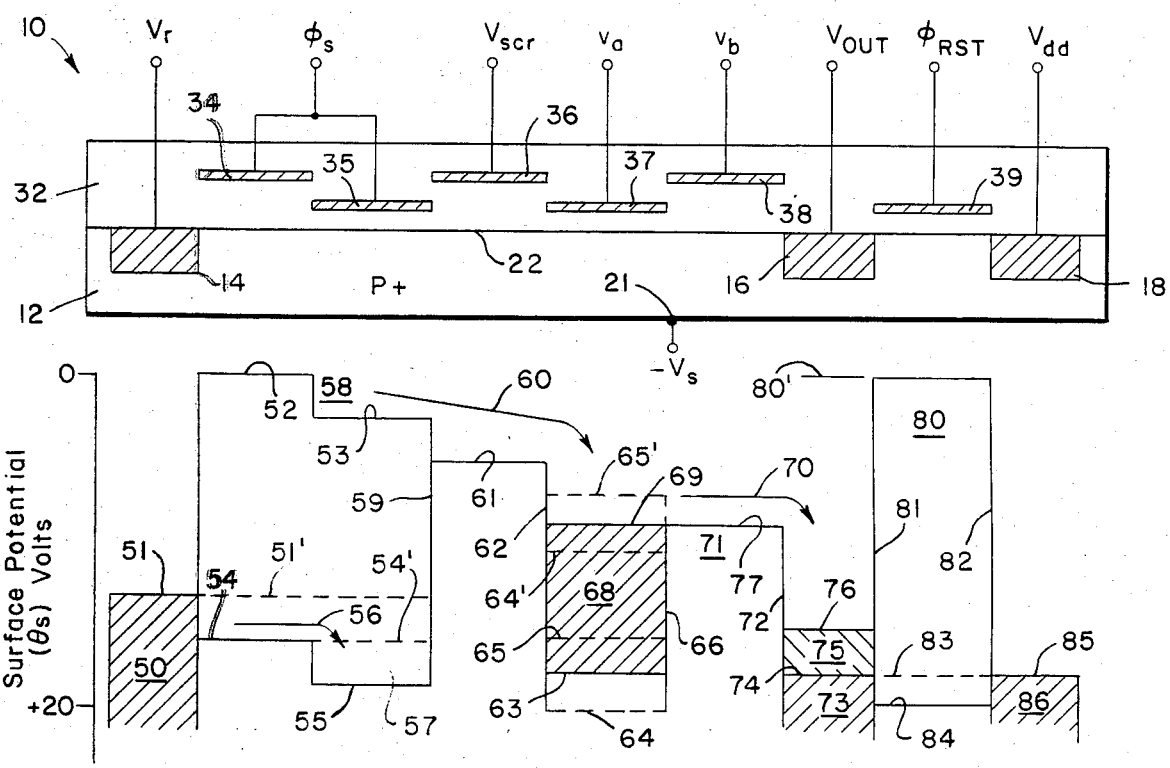
Fig. 2.
Fig. 2a.

4,501,007

CCD DIFFERENTIATOR

This is a continuation of Application Ser. No. 909,329, filed May 25, 1978, now abandoned.

BACKGROUND OF THE INVENTION

This invention is in the field of charge transfer or charge coupled devices, and particularly in the field of such devices used for differentiating an electrical signal.

Charge coupled devices exhibit the advantages of low power consumption, small size and non-critical electrode biasing, which advantages in recent years have spurred extensive development of such devices. A major portion of such charge coupled device development activity has been directed towards providing improved charge coupled device shift registers which, for example, may be utilized for data storage or for implementing time delays in data processing. However, in many applications it is desirable to differentiate the data signal prior to its being processed by a charge coupled device and the heretofore methods of implementing the differentiation function, such as those using an operational amplifier or a digital computer having negated much of the size and power consumption advantages which might be gained by employing charge coupled devices for subsequent data processing. A significant aspect of the subject invention is a recognition of the fact that a differentiator device which could be implemented by means of fabrication techniques currently used to mechanize charge coupled devices would be a most significant advantage to the related art.

SUMMARY OF THE INVENTION

An object of the invention is to enable one or more AC voltages to be differentiated utilizing charge transfer or charge coupled techniques.

A further object of this invention is to enable coupling of an AC input signal from to a circuit without passing any DC components, utilizing charge transfer or charge coupled principles.

According to this invention, a charge transfer differentiator is provided having a layer of semiconductor material and a contiguous film of overlying electrically insulating material in which are embedded groups of electrodes connected to external voltage sources of clock sources.

An electrode is energized by an input voltage wherein the electrode is embedded in the film, thus establishing an electric potential at the interface between the film and layer.

Another electrode is energized by a DC voltage and still another electrode is fed by another input voltage, wherein these electrodes are embedded in the film and charge-coupled to the first mentioned electrode, thereby establishing potential barriers at the interface. The first and second mentioned electrodes and their applied voltages provide a potential well at the interface.

Yet another electrode within the layer is fed by another DC voltage and still further additional electrodes are fed by a clock voltage. These last named electrodes are charge-coupled to the first named electrode which is DC energized, thereby providing a constant input charge to said potential well. The electrodes and their applied voltages, above discussed, enable the device to differentiate any one of many AC input voltages applied to the device.

BRIEF DESCRIPTION OF THE DRAWINGS

FIG. 1 is a perspective view of the differentiator assembly.

FIG. 2 is a cross-section view taken at plane 2—2 of FIG. 1.

FIG. 2a is a charge and potential profile of FIG. 2.

STRUCTURE DETAILED DESCRIPTION

Figure 3:
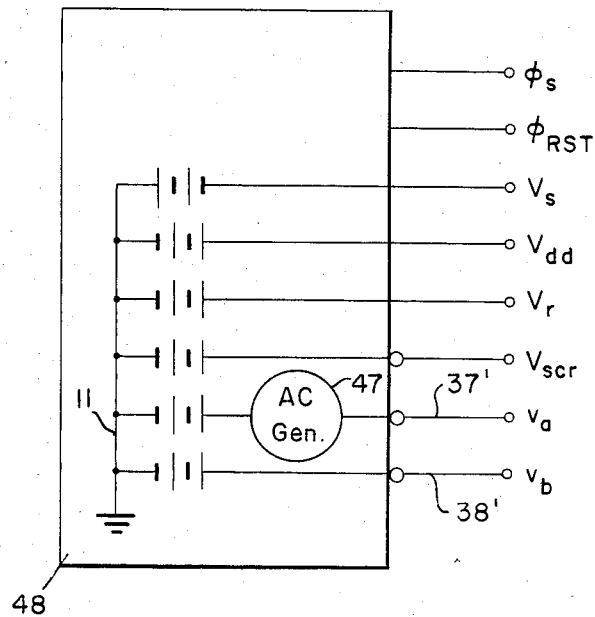
FIG. 3 is a block schematic representation of various voltages and clock sources used for interconnection with the device of FIG. 2.

Referring to FIGS. 1, 2, 2a, 3 and 4 herein, a charge transfer (sometimes referred to as charge coupled) device 10 is provided for differentiating an input signal to such device.

Device 10 has a semiconductor body 12 generally of silicon, however other semiconductor materials such as germanium could have been utilized as body 12. Body 12 is shown as P+ conductivity doped silicon material, however it is understood that other conductivity type materials, such as N types may be used.

Electrode 18 partially embedded within 12 is hard wire interconnected and fed by DC potential $V_{dd}$ with respect to ground potential 11. Another DC voltage is powered by battery $V_s$ with the negative side of $V_s$ connected to substrate 12 at point 21, the positive side of battery $V_s$ being at ground potential 11. $V_s$ therefore provides a negative DC bias to substrate 12.

Figure 5:
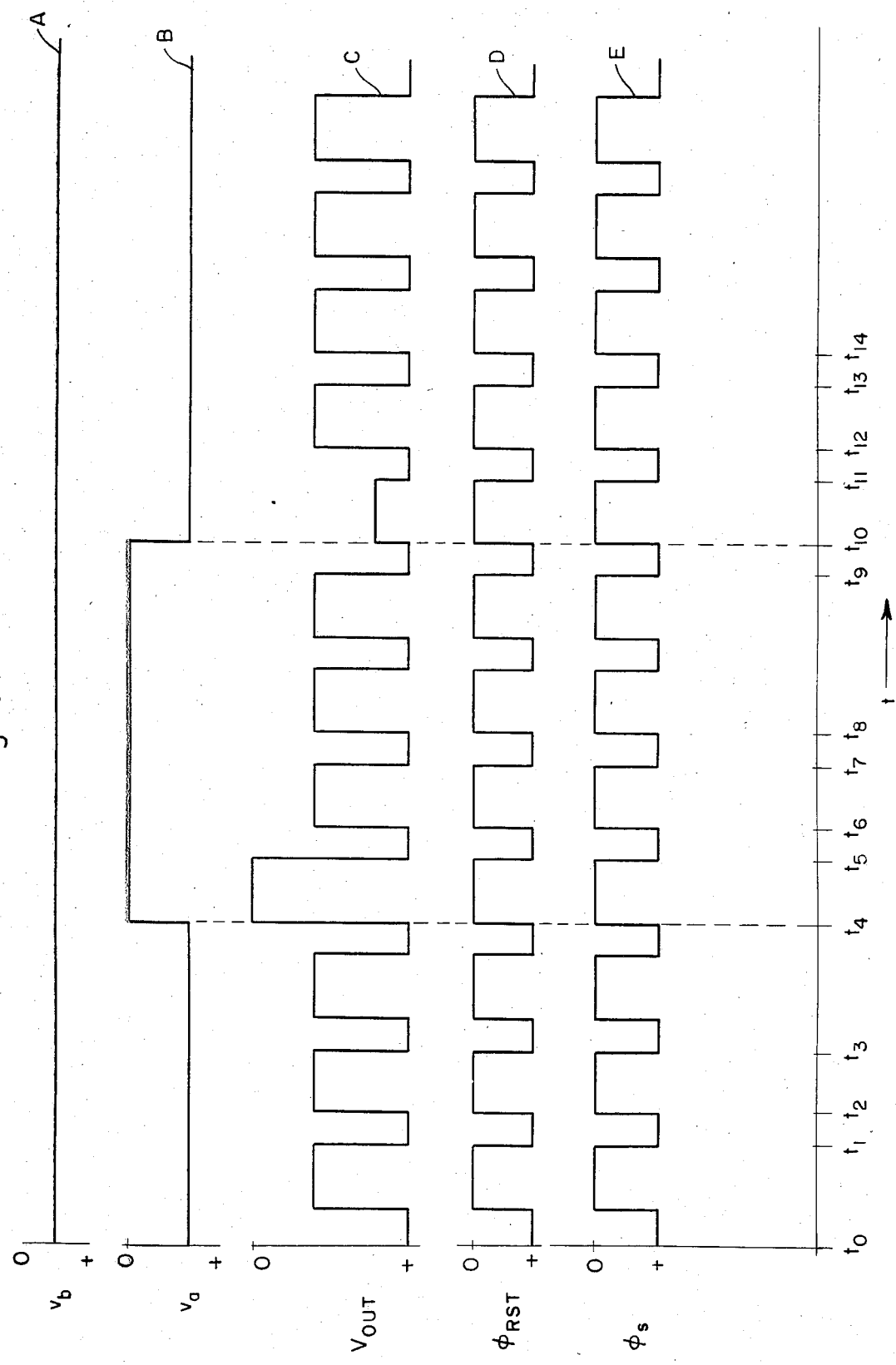
FIG. 5 is a set of waveforms of the various voltages and clock signals feeding the device in one mode of its operation.
Figure 6:
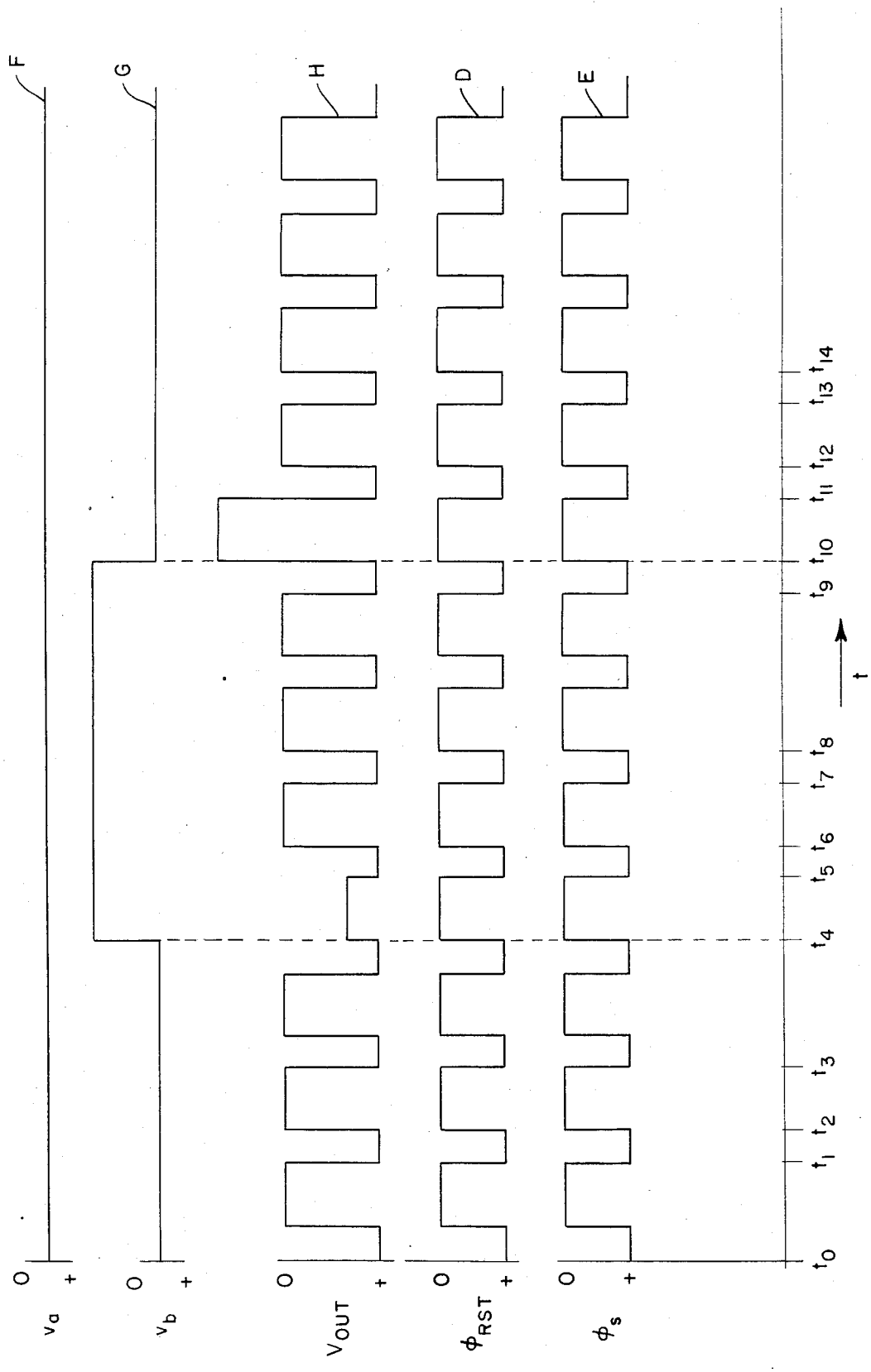
FIG. 6 is a set of waveforms of the various voltages and clock signals in another mode of device operation.

Electrode 16 is partially embedded within body 12. Electrode 16 has a hard wire connection for providing an output thereat and thereby providing a waveform output as shown in FIGS. 5 and 6.

Electrode 14 is partially embedded within body 12, and is hard wire interconnected and fed by DC potential $V_r$ with respect to ground potential 11.

An electrically insulating film 32 of $SiO_2$ is deposited over layer 12 and forms an interface at 22 with layer 12 and with the upper surfaces of each of electrodes 14, 16 and 18. It is understood that other insulating films may be used.

Gate electrode 39 embedded in film 32, is provided with hard wire connections to a terminal at $\phi_{RST}$. The voltage at $\phi_{RST}$ is illustrated as waveform D in FIG. 5 and consists of a series of rectangular pulses which provide a RESET function to device 10, thereby resetting outputs $V_{OUT}$ to $V_{dd}$ potential prior to recycling the operation performed by device 10.

Figure 4:
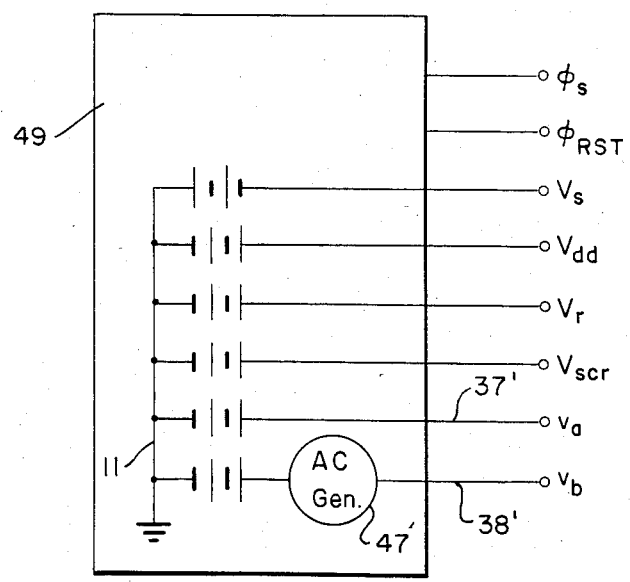
FIG. 4 is a block schematic representation of another form of the various voltage and clock sources used for interconnection with the device of FIG. 2.

Electrodes 37 and 38, bound within the confines of film 32, adjacently spaced in different planes are respectively electrically connected to voltage sources 37' and 38' of power sources 48 or 49 as shown in FIGS. 3 and 4. Voltages $v_a$ and $v_b$ shown in FIGS. 5 and 6 as waveforms A and B in FIG. 5 and waveforms F and G in FIG. 6, represent the input voltages to the differentiator.

Gate electrode 36 embedded in film 32, is hard wire interconnected and fed by DC potential $V_{scr}$ with respect to ground potential 11.

Gate electrodes 34 and 35 are embedded in film 32 and are hard wire interconnected to clock voltage source $\phi_s$ as shown at power sources 48 and 49 of FIGS. 3 or 4 respectively.

It should be noted that voltages $V_{dd}$, $V_r$, and $V_{scr}$ are provided by power source 48 and 49, shown in FIGS. 3 and 4. Clock signals $\phi_{RST}$ and $\phi_s$ are also provided by other sections of sources 48 and 49.

It should be noted that sources 48 and 49 both contain the AC generator 47 used as an input signal source. In source 48, AC generator 47 is connected at 37' in the $v_a$ voltage supply, and in power source 49, AC generator 47 is connected at 38' in the $v_b$ voltage supply.

Referring specifically to FIGS. 2, 2a, 3 and 4, in order to further clarify the manner of operation of this device as a differentiator, it should be emphasized that the device utilizes three contiguous electrodes 36, 37 and 38, within the insulative material, where the input signal is to either gate electrode 37 or 38.

When electrode 37 is connected to signal input $v_a$ at 37', including AC generator 47 as shown in FIG. 3, the differentiator is said to be non-inverting, that is, a positive going signal input results in a positive going waveform output. When electrode 38 is connected to a signal input $v_b$ at 38', including AC generator 47, as shown in FIG. 4, the differentiator is said to be inverting, that is, a positive going signal input results in a negative going waveform output.

Gate electrode 36 is biased by voltage $V_{scr}$ such that voltage $V_{scr}$ provides a barrier 61, so that charges transferred over barrier 61, via electrodes 14, 34 and 35, may only move in accordance with charge flow direction arrows 60 and 70. Gate electrodes 14, 34 and 35 are biased and clocked so that a constant non-changing amount of charge is generated and transferred over barrier 61 for each operation of the CCD differentiator.

Gate electrode 37 is biased more positive than electrode 38, so that a substantial charge well 68 is created. The first several clock cycles of the constant input charge generator, consisting of gate electrodes 14, 34 and 35, creates a constant amplitude input charge packet which will initially supply charge to fill well 68 to level 69.

The function of the non-inverting differentiator, applying the signal input generator to gate 37, using source 48, as shown in FIG. 3, will be hereinafter described. A changing input signal waveform applied to gate 37 will cause the bottom of well 68 to change potential, resulting in a changed charge storage capacity of that well. Differentiation occurs by subtracting and providing an output of the difference between the previous input signal amplitude (charge quantity in well 68) and the present input signal voltage amplitude (the present charge capacity of well 68'. This is accomplished when a change in the signal input amplitude causes the charge in well 68 to either be added to or subtracted from the constant input charge packet 57. When the input signal changes so that a change of potential in well 68 makes a transition from level 63 to 65, the charge in well 68 proportional to such change, is raised to level 65, resulting in level 65' being above potential 77 of barrier 71, and such charge above the level 77 is transferred over barrier 71 into the output sense area 75, and is added to the constant input charge packet 57. When the signal creates a change in potential from level 63 to 64, charge level 69 will move to level 64'. When the constant input charge packet 57 is transferred over barrier 61 into well 68, the charge represented by the difference between levels 69 and 64' is substrated from the constant input charge packet 57, satisfying the necessary charge condition to have well 68 filled to level 69.

Referring particularly to FIGS. 2, 2a, 3, and 5, device 10 may be functionally described in terms of its potential profiles and waveforms A through E shown in FIG. 5.

At time $t_1$, waveform E representing clock $\phi_s$ changes from potential levels 52–53 to levels 54–55. Charge supply source 14 provides a charge 50 at surface potential $(\theta_s)$ level 51. Charge well 57 is now filled with charge from source 50 indicated by charge flow direction arrow 56 until the charge in well 57 fills to level 51'.

At time $t_2$, waveform E makes a transition shifting levels 54–55 to levels 52–53. Charge well 57 retains charge to level 54', with excess charge from well 57 returning to charge source 50. Thus, the generation of a charge, constant with each cyclical operation of clock $\phi_s$ feeding gates 34 and 35 has been described. This constant charge is necessary for device 10 operation. At time $t_2$ and all other periods of positive to zero transitions of clock $\phi_s$, such as time locations at $t_6$, $t_{10}$, and $t_{14}$, for example, illustrated by waveform E of FIG. 5, the charge source 14 and the clock $\phi_s$ generate a like charge which is transferred from area 58 over barrier 61 and into charge well 68, as indicated by charge flow direction arrow 60.

Charge well 68 is defined by walls 62 and 66 and by voltage $v_a$ applied to gate 37 establishing the bottom of well 68, as per example at 63, 64 and 65. For a non-changing input voltage condition, $v_a$, similar to waveform B from $t_o$ to $t_4$, well 68 will fill from constant charge packet 57 transferred over barrier 61. Initially, several clock period operations of device 10 will be required to completely fill well 68 to level 69, which level 69 is equal to the potential 77 of barrier 71. The potential 77 is created by the applied DC bias $v_b$ to gate 38. Upon completion of filling well 68, those constant input charge packets 57 transferred over barrier 61 will now flow over well 68, over barrier 71, and into the output sense area 75, such sense area being defined by walls 72 and 81 and surface 74 of charge area 73.

The charge appearing at output charge sense area 75, creates a change in the surface potential, at interface 22 between the surfaces of semiconductor 12 and insulator 32, proportional to the quantity represented by the difference between level 74 and level 76, and is sensed by electrode 16 giving rise to output voltage waveform $v_{OUT}$ as shown by waveform C.

The function of barrier 80 is to disconnect or turn off the reset mechanism, consisting of gate electrode 39 and electrode 18 during periods $t_2$-$t_3$, $t_4$-$t_5$, $t_6$-$t_7$, $t_{10}$-$t_{11}$, $t_{12}$-$t_{13}$ and all other such periods as shown in FIG. 5. Barrier 80 is bounded by potential 80', wall 81 and wall 82 of barrier 80.

At $t_1$, waveform D switches from zero to a positive voltage, thereby switching the potential level 80' to level 84. Such switching produces a low resistance path between well 75 and potential level $V_{dd}$ at 85, thereby providing the required mechanism to reset well 75 from level 76 to level 74. Level 74 is at the same potential as level 85.

It should be noted that potential area 86 is created by DC voltage $V_{dd}$ and is not a well, because no charge can be stored thereat, since area 86 is essentially a charge drain or sink.

The operation of device 10 is explained below in its non-inverting mode, utilizing waveform B which has a long input rectangular waveshape.

Assuming the condition previously described, with well 68 being fully charged, a non-changing input voltage waveform B during period $t_0$-$t_4$, the constant input charge packet 57 is transferred over barrier 61 and will flow over barrier 71 according to charge direction flow arrow 70, and appear at the output sense well 75 in a non-changing manner with each operation of device 10.

At time $t_4$, input signal $v_a$ changes in a direction less positive and remains at this potential until $t_{10}$. Such change of applied voltage moves the bottom potential of well 68 from position 63 to position 65. The change from 63 to 65 reduces the charge capacity of well 68 and displaces a proportional amount of charge to level 65' above barrier 71. The charge represented by the difference in levels 69 and 65' is proportional to the change in applied signal voltage $v_a$ input to device 10. Charge difference 69-65' flows over barrier 71 in accordance with charge direction arrow 70 into output sense area 75. Simultaneously, constant amplitude input charge packet 57 is transferred over barrier 61 into well 68 and is also transferred to the output sense area 75. Displaced charge 69-65' from well 68 and the constant charge packet 57 are combined in output sense well 75, and cumulatively give rise to an output amplitude less positive, by the amount of displaced charge 69-65'. Waveform C shows voltage $V_{OUT}$ at $t_4$-$t_5$ as being less positive than such waveform at $t_0$-$t_4$.

During the $t_5$-$t_6$, the output sense area is reset as hereinabove described.

At time $t_6$, a new constant amplitude charge packet 57 is transferred over barrier 61 and appears at output sense area 75, in a manner as hereinabove described, giving rise to a non-changing amplitude of $V_{OUT}$ similar to the non-changing amplitude at $t_0$-$t_4$. The presence of packet 57 results in waveform C between $t_6$-$t_7$ being at the same level as such waveform assumed during period $t_0$-$t_4$.

Hence, during period $t_6$-$t_7$ the bottom of well 68 is at 65, and therefore the charge in well 68 plus applied voltage $v_a$ does not result in adding or subtracting any charge from constant input charge packet 57. Sense area 75 is reset at $t_7$ in a manner as hereinabove described.

During period $t_7$-$t_{10}$, the operation of the device and results obtained will be the same as during period $t_5$-$t_8$.

At time $t_{10}$ the input voltage $v_a$ changes in a positive going direction to a value equal to the original amplitude at $t_o$. This change in applied voltage moves the bottom of well 68 from location 65 to location 63 therefore increasing the charge capacity of well 68. The charge remaining in well 68, from the previous operation of device 10, is such that it fills well 68 to level 64'. This indicates a charge deficit in well 68 with respect to its full level at 69. Simultaneously, the constant input charge packet 57 is transferred over barrier 61 into well 68 and will provide such charge as is necessary to fill well 68 to level 69, and therefore packet 57 will be reduced in amplitude by that amount. In like manner, the result of the charge in area 75 being sensed, is illustrated by waveform C during period $t_{10}$-$t_{11}$.

At $t_{12}$, and thereafter, input voltage $v_a$ does not change, and with well 68 filled with charge to level 69, $V_{OUT}$ has an output as illustrated by waveform C.

The function of the inverting differentiator, applying the signal input generator to gate 38, using source 49, as shown in FIG. 4, will be hereinafter described. A changing input signal waveform applied to gate 38 will cause the top of well 68 to change potential, resulting in a changed charge storage capacity of that well. Differentiation occurs by subtracting and providing an output of the difference between the previous input signal amplitude (charge quantity in well 68) and the present input signal voltage amplitude (the present charge capacity of well 68). This is accomplished when a change in the signal input amplitude causes the charge in well 68 to either be added to or subtracted from the constant input charge packet 57.

Referring particularly to FIGS. 2, 2a, 4 and 6, device 10 may be functionally described in terms of its potential profiles and waveforms D through H shown in FIG. 6.

Charge well 68 is defined by walls 62 and 66 and by the voltage $v_a$ applied to gate 37, establishing the bottom of well 68, as per example at 65. For a non-changing input voltage condition, $v_b$, similar to waveform G from $t_0$-$t_4$, well 68 will fill from constant charge packet 57 transferred over barrier 61. Initially, several clock period operations of device 10 will be required to completely fill well 68 to level 69, which level 69 is equal to the potential 77 of barrier 71. The potential 77 of barrier 71 is created by the applied voltage $v_b$ to gate 38. Upon completion of filling well 68, those constant input charge packets 57 transferred over barrier 61 will now flow over well 68, over barrier 71, and into the output sense area 75, such sense area being defined by walls 72 and 81 and surface 74 of charge area 73.

The charge appearing at output charge sense area 75, creates a change in the surface potential $\theta_s$ at the interface 22 between the surfaces of semiconductor 12 and insulator 32, proportional to the quantity represented by the difference between level 74 and level 76, is sensed by electrode 16 giving rise to output voltage waveform $V_{OUT}$ as shown by waveform H.

The function of barrier 80 is to disconnect or turn off the reset mechanism, consisting of gate electrode 39 and electrode 18 during periods $t_2$-$t_3$, $t_4$-$t_5$, $t_6$-$t_7$, $t_{10}$-$t_{11}$, $t_{12}$-$t_{13}$ and all other such periods as shown in FIG. 6. Barrier 80 is bound by potential 80', wall 81 and wall 82 of barrier 80.

At $t_1$, waveform D switches from zero to a positive voltage, thereby switching the potential level 80' to level 84. Such switching produces a low resistance path between well 75 and potential level $V_{dd}$ at 85, thereby providing the required mechanism to reset well 75 from level 76 to level 74. Level 74 is at the same potential as level 85.

It should again be noted that potential area 86 is created by DC voltage $V_{dd}$ and is not a well, because no charge can be stored thereat, since area 86 is essentially a charge drain or sink.

The operation of device 10 is explained below in its inverting mode, utilizing waveform G which has a long input rectangular waveshape.

Assuming the condition previously described with well 68 being fully charged and a non-changing input voltage waveform G during period $t_0$-$t_4$, the constant input charge packet 57 is transferred over barrier 61 and will flow over barrier 71 according to charge direction flow arrow 70, and appear at the output sense well 75 in a non-changing manner with each operation of device 10.

At time $t_4$, input signal $v_b$ changes in a direction less positive and remains at this potential until $t_{10}$. Such change of applied voltage moves the potential 77 of barrier 71 to a position less positive. The change from potential 77 to a less positive position increases the charge capacity of well 68 and will displace a proportional amount of charge 69-65' above potential 69 and equal to barrier 71. The charge represented by the difference in levels 69-65' is proportional to the change in applied signal voltage $v_b$ input to device 10. Simultaneously, the constant input charge packet 57 is transferred over barrier 61 into well 68 and will provide such charge as is necessary to fill well 68 to level 65' and therefore packet 57 will be reduced in amplitude by that amount. Waveform H shows voltage $V_{OUT}$ at $t_4$-$t_5$ as being more positive than such waveform at $t_0$-$t_4$.

During time $t_5$-$t_6$, the output sense area is reset as hereinabove described.

At time $t_6$, a new constant amplitude charge packet 57 is transferred over barrier 61 and appears at output sense area 75, in a manner as hereinabove described, giving rise to a non-changing amplitude of $V_{OUT}$ similar to the non-changing amplitude at $t_0$-$t_4$. The presence of packet 57 results in waveform H between $t_6$-$t_7$ being at the same level as such waveform assumed during period $t_0$-$t_4$.

Hence, during period $t_6$-$t_7$ the top of well 68 is at 65', and therefore the charge in well 68 plus applied voltage $v_b$ does not result in adding or subtracting any charge from constant input charge packet 57. Sense area 75 is reset at $t_7$ in a manner as hereinabove described.

During period $t_7$-$t_{10}$, the operation of the device and results obtained will be the same as during period $t_5$-$t_8$.

At time $t_{10}$ the input voltage $v_b$ changes in a positive going direction to a value equal to the original amplitude at $t_o$. This change in applied voltage moves the potential of barrier 71 from a location equal to that of 65' to location 77 therefore decreasing the charge capacity of well 68.

Charge differences 69-65' flows over barrier 71 in accordance with charge direction arrow 70 into output sense area 75. Simultaneously, constant amplitude input charge packet 57 is transferred over barrier 61 into well 68 and is also transferred to the output sense area 75, where it is combined with charge 69-65' from well 68, and cumulatively gives rise to an output amplitude less positive, by the amount of displaced charge 69-65'. In like manner, the result of the charge in area 75 being sensed, is illustrated by waveform H during period $t_{10}$-$t_{11}$.

At $t_{12}$, and thereafter, input voltage $v_b$ does not change, and with well 68 filled with charge to level 69, $V_{OUT}$ will provide an output as illustrated by waveform H.

It is noted that device 10, without any structural or applied voltage and clock inputs, can be used as a signal or AC coupler for coupling a signal applied to either inputs at $v_a$ or $v_b$, and obtain voltage outputs due to either of the inputs, at terminal $V_{OUT}$. Therefore device 10 in fact acts as a blocking capacitor to block DC and to pass any AC signals.

The charge coupled differentiator may be compared with the conventional capacitor-resistor differentiator in terms of charge flow, wherein the differentiated form of an input voltage is obtained across the resistor. In this conventional differentor, a voltage input provides a current flow through the capacitor ($1/c \int i \, dt = 1/c \, q$). As the capacitor is accumulating current, it is also accumulating charge. Since there is a resistor present, as the charge q is being accumulated, it is also being drained by the resistor as a function of time ($dq/dt$).

The rate of change of applied signal voltage, such as $v_a$, provides a changing quantity of charge flowing from well 68 to output sense area 75, and sensed at $V_{OUT}$. Such charge flow ($dq/dt$ = current) is analogous to the charge flow between the capacitor and resistor of the conventional differentiator circuit.

What is claimed is:

1. A charge coupled device for differentiating an input signal, comprising:
   means for providing a potential well for storing charge;
   means for periodically generating a charge packet of fixed value and for applying said charge packet to said well;
   means for changing the capacity of said well in response to said input signal such that the change in capacity of said well corresponds to the change in potential of said input signal; and
   means for providing an output signal representative of the change in capacity of said well.

2. A charge coupled differentiator, comprising:
   a semiconductor substrate;
   input section means for providing a constant average value of input current into a current channel in said substrate;
   first gate means contiguously disposed relative to a region of said substrate along said current channel for defining a first charge storage area having a charge storing capacity which varies as a function of voltage signals applied to said first gate means; and
   means for producing an output signal representative of the change in charge storage capacity of said charge storage area; whereby said output signal is proportional to the time rate of change of the voltage signals applied to said first gate means.

* * * * *